United States Patent [19]

Jensen

[11] 4,242,594

[45] Dec. 30, 1980

[54] SWITCH ARRANGEMENT

[75] Inventor: Torkil H. Jensen, Del Mar, Calif.

[73] Assignee: General Atomic Company, San Diego, Calif.

[21] Appl. No.: 20,963

[22] Filed: Mar. 16, 1979

Related U.S. Application Data

[63] Continuation-in-part of Ser. No. 933,640, Aug. 14, 1978, abandoned.

[51] Int. Cl.³ .................... H02H 7/22; H03K 17/72
[52] U.S. Cl. .................................................... 307/98
[58] Field of Search .............. 307/104, 98, 100, 135, 307/137, 140, 252 J, 252 K, 252 L, 252 M; 200/144 AP

[56] References Cited

U.S. PATENT DOCUMENTS

| | | | |
|---|---|---|---|
| 3,585,403 | 6/1971 | Gribbons | 307/252 L |
| 3,626,271 | 12/1971 | Dewey | 307/252 L X |
| 3,651,374 | 3/1972 | Faust | 307/252 L X |
| 3,772,532 | 11/1973 | Petrov et al. | 307/252 L |

Primary Examiner—George H. Miller, Jr.
Assistant Examiner—James L. Dwyer
Attorney, Agent, or Firm—Fitch, Even, Tabin, Flannery & Welsh

[57] ABSTRACT

A switch arrangement for interruption of an electrical current in a circuit with a large self-induction. One application of the switch arrangement is for systems where energy stored in an inductor is to be transferred to a load. In this case, the switch arrangement is coupled in parallel with the load. The switch arrangement consists of a current interrupting means and a plurality of thyristors being connected in series in their forward direction. A circuit comprised of a plurality of serially connected sets of a resistor and a nonlinear element is connected in parallel with the serially connected current interrupting means and thyristors, the nonlinear element impeding flow of current through it when the voltage, or the time integral of the voltage thereacross is small, and more fully allowing current to flow therethrough when the voltage, or the time integral of the voltage is large. One of the resistor-nonlinear element sets is associated with one of the thyristors. A plurality of capacitors is connected between the resistor-nonlinear element circuit and the thyristors, the capacitors being connected between respective associated resistor-nonlinear element sets and thyristors.

7 Claims, 4 Drawing Figures

SWITCH ARRANGEMENT

This application is a continuation-in-part of my prior filed application, Ser. No. 933,640, filed Aug. 14, 1978, now abandoned.

The present invention relates to electrical switches that are capable of interrupting high amperage direct currents in a high voltage circuit and, more particularly, is directed to a switch arrangement that can operate in series with a large self-inductor having a high amperage direct current flowing therethrough.

The problem of designing a switch that can operate in series with a large self-inductor having a high amperage direct current flowing therethrough whereby a large voltage develops across the switch when it opens is a well-known one. Such a switch is needed wherever an inductor is used for energy storage as, for example, in plasma confinement systems, in DC to AC conversion for DC power transmission, or in safety circuits. An ideal switch is a circuit element that when opened, brings the current through it to zero instantly and is able to withstand any voltage developed across it. Thus, when closed, the resistance of an ideal switch is zero and when open it is infinitely large.

The present invention is directed to a switch arrangement which differs from an ideal switch in that when open its resistance is large but not infinite. Such a switch arrangement has the property that its resistance during its process of opening increases linearly with time. Normally, in such switch arrangements many switch elements are connected in series because each switch element is not capable of withstanding the required voltage. Such switch elements may be mechanical switches, reverse blocking triode thyristors, or other devices. Commutation is required in switch elements, that is, the current through them must, by means of a commutating circuit, be brought to zero before the switch elements will be rendered non-conductive and withstand voltage without passing current through them. In addition, the circuits for such switch arrangements should insure that the voltage is shared properly between each switch element.

An object of the present invention is the provision of a switch arrangement that is capable of interrupting large currents in a high voltage circuit. Another object is the provision of a switch arrangement having a reduced number of parts and hence one that is relatively less expensive.

Other objects and advantages of the present invention will become apparent by reference to the following description and accompanying drawing wherein.

Figure 1:
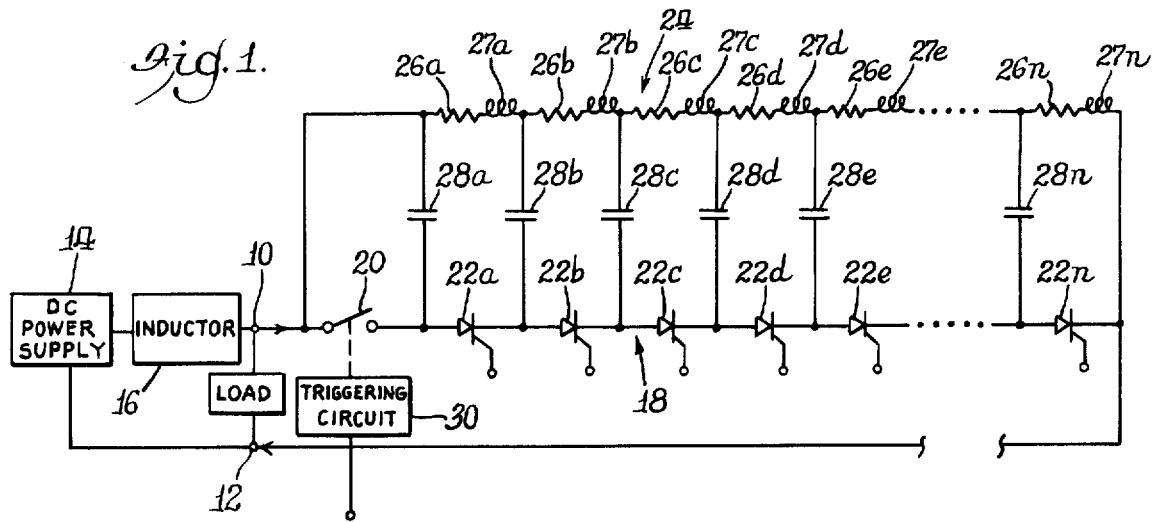
FIG. 1 is a schematic circuit diagram of a switch arrangement in accordance with the present invention.

Generally, in accordance with the present invention a switch arrangement is provided for interrupting a high amperage direct current in a high voltage circuit. An example of such a circuit is shown in FIG. 1. The switch arrangement includes a pair of terminals 10 and 12 which are connected parallel with a load 15 which is coupled in series with a direct current power supply and an inductor 16. Connected in series with the pair of terminals 10 and 12 is a switch element circuit 18 comprised of a current interrupting means 20 and a plurality of thyristors 22a through 22n connected in their forward direction. A resistor-nonlinear element circuit 24 comprised of a plurality of serially connected sets of a resistor 26a through 26n and a nonlinear element 27a through 27n is connected in parallel with the switch element circuit 18. The nonlinear element impedes the flow of current through it when the voltage or the time integral of the voltage is small and more freely allows current to flow therethrough when the voltage or time integral of the voltage is large. One of the resistor-nonlinear element sets is associated with one of the thyristors 22a through 22n. A plurality of capacitors 28a through 28n are connected between the resistor-nonlinear element circuit 24 and the switch element circuit 18, the capacitors being connected between respective associated resistor-nonlinear element sets and thyristors.

More particularly, as shown in FIG. 1, the switch arrangement is employed to interrupt a high amperage direct current flowing through the inductor 16 which is an inductive energy storage device. The source 14 of the direct current may be a conventional high amperage direct current power supply 14 connected in series with the inductor 16. The switch arrangement is conducted in series with the source 14 and the inductor 16 and includes the input terminal 10 and the output terminal 12. The input terminal 10 is connected to one end of the current interrupting means 20, which may be a mechanical switch, thyristor or other device. In the embodiment illustrated in FIG. 1, the current interrupting means 20 is a mechanical switch operated by a solenoid which is closed or opened by the energization of a triggering circuit 30.

The other end of the current interrupting means 20 is connected to the input end of the plurality of the series connected thyristors 22a through 22n connected in the forward direction. The thyristors may be conventional high current, high voltage silicon controlled rectifiers (SCR's). The other end of the series connected SCR's is connected to the terminal 12. The number of SCR's 22 provided depends on the voltage developed across the switch arrangement when opening and the forward holding voltage characteristics of the SCR. For example, if the SCR can withstand a voltage of 1000 volts, i.e., the forward holding voltage characteristic is greater than 1000 volts, and a voltage of 20 kilovolts is developed, then 20 SCR's are needed. Of course, the SCR selected should have an average forward current carrying capability greater than the required current flow.

As shown in FIG. 1, the resistor-nonlinear element circuit 24 includes a plurality of series connected sets of one resistor 26a through 26n and one nonlinear element 27a through 27n and is connected between the input terminal 10 and the output terminal 12. The nonlinear element is a device having a characteristic such that it impedes flow of current through it (i.e., its impedance is high) when the voltage or the time integral of the voltage is small and more freely allows current to flow when the voltage, or time integral of the voltage is large (i.e., its impedence is low). In FIG. 1, the nonlinear element is a saturable inductor. One resistor 26a through 26n and one saturable inductor 27a through 27n (i.e., one set) are provided for each thyristor 22a through 22n. Preferably, the resistors are of equal resistance and the saturable inductors are of equal inductance and saturation characteristics.

A plurality of the capacitors 28a through 28n are connected respectively between the resistor-saturable inductors sets and the thyristors 22a through 22n. One of the capacitors 28a through 28n is connected between the input end of each resistor-saturable inductor set and the input end of the associated SCR 22a through 22n. Thus, one SCR, one resistor-saturable reactor set, and one capacitor comprise a module, the number of modules that are provided depending upon the desired voltage caross the terminals 10 and 12 and the forward voltage holding capabilities of the SCR's.

When the current interrupting means 20 is closed and all of the SCR's 22a through 22n are in the conducting state, the resistance of the switch arrangement is small because it consists of the sum of the forward resistance of the current interrupting means 20 and conduction resistance of the SCR's 22a through 22n. When it is desired to open the switch arrangement the current interrupting means 20 is opened by energizing the triggering circuit 30. After the switch arrangement completes its opening operation, described hereinafter, the switch arrangement appears as a resistance equal to N times R, where N is the number of resistors and R is equal to the resistance of one resistor. Because the resistors have identical resistances, the voltage across the switch arrangement is shared equally by the resistors. For example, assuming a voltage of 20 kilovolts across the switch arrangement and 20 resistors, a voltage of 1000 volts is developed across each resistor. If the current through the switch arrangement is 1000 amperes, the resistors are 1 ohm each. When the current interrupting means 20 is first opened, the current will bypass the current interrupting means 20 through the first capacitor 28a. As the voltage across the first capacitor 28a builds up it causes the current to flow through the first resistor 26a and the first saturable inductor 27a and mainly through the second capacitance 28b. When the saturable reactor 27a saturates, the current through the first SCR 22a decreases to zero or below its holding current, thereby causing the first SCR 22a to assume its forward blocking state. This operation continues throughout the rest of the modules until all of the SCR's 22a through 22n are rendered blocking and the entire voltage appears across the resistors 26a through 26n and the saturable inductors 27a through 27n.

The switch arrangement operates as desired and described above for certain combinations of the following quantities: the resistance value (R) of each resistor 26a through 26n; the inductance (L) of each saturable inductor 27a through 27n in its unsaturated state; and ratio $I_s/I_o$, where $I_s$ is the saturation current of the saturable inductors and $I_o$ is the current through the switch; and the capacity (C) of each capacitor 28a through 28n. Combinations of these quantities that will allow proper operation of the switch arrangement are approximately those that satisfy the inequality:

$$R\sqrt{\frac{C}{L}} < 0.63 - 2.5\left(\frac{I_s}{I_o} - 0.5\right)^2$$

$I_s$ should be made smaller than $I_o$ and the inductance of the saturable reactors 27a through 27n in their saturated state should be small compared to their inductance in their unsaturated state. The choices of R, L, $I_s/I_o$ and C also determine the time between turn offs of successive SCR's. This time is approximately proportional to $\sqrt{LC}$. In the design of a switch arrangement, this time should be sufficiently long compared to the deionization time of the SCR's to insure that they can withstand the developing forward voltage after turn off. For example, if the deionization time of each SCR is equal to $10^{-4}$ seconds and the resistors are 1 ohm each, then an inductance of approximately $10^{-3}$ henries and a capacitor of approximately $10^{-5}$ farads may be used. With these values, and if 20 modules are used, it takes about $20 \times 10^{-4}$ seconds to develop the full voltage across the terminals 10 and 12.

Figure 2:
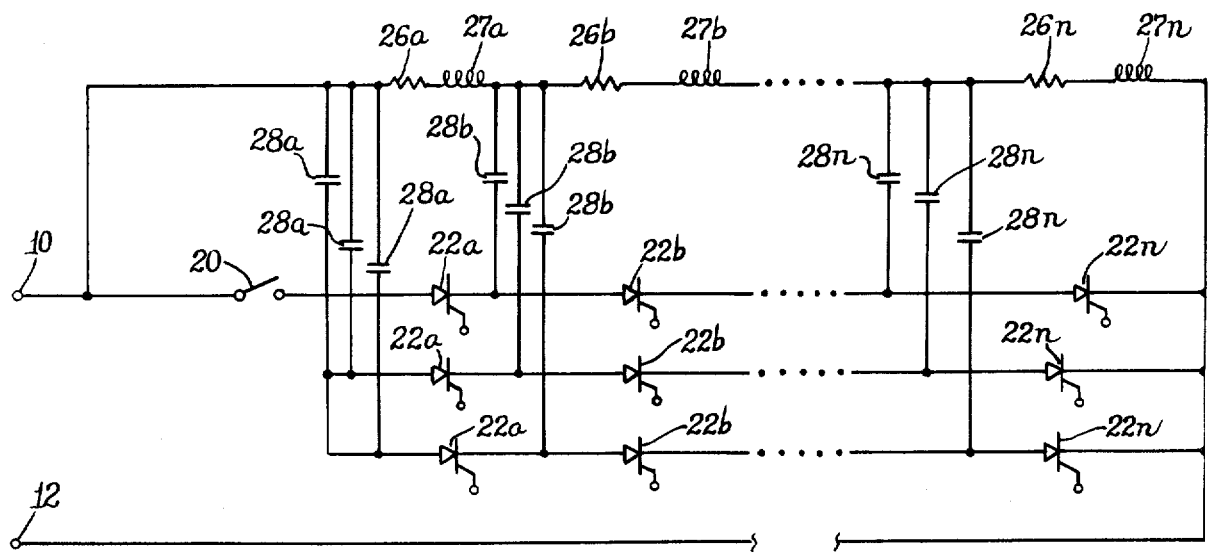
FIG. 2 is a schematic circuit diagram of another embodiment of the switch arrangement of the present invention.

FIG. 2 shows another embodiment of the switch arrangement. This embodiment provides an increased current capacity and includes three switches element circuits 18 connected by capacitors to a common resistor-saturable inductor circuit 24. In this connection, parts similar to those in FIG. 1 are indicated with the same reference numerals.

Figure 3:
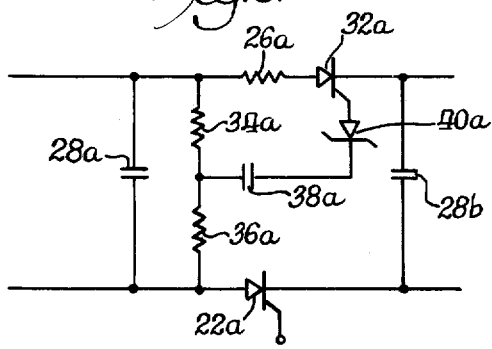
FIG. 3 is a schematic circuit diagram of a portion of still another embodiment of the switch arrangement of the present invention.

In FIG. 1, the nonlinear element is a saturable inductor. However, other devices which have the needed characteristics are: a spark gap (triggered or breaking down by over voltage); a tunnel diode; a triggered SCR; and triggered ignitrons. FIG. 3 shows a triggered SCR 32a being used as the nonlinear element in the first module. Each module of the switch arrangement would have such a triggered SCR as the nonlinear element.

As shown in FIG. 3, the SCR 32a is triggered by a predetermined voltage appearing across the associated capacitor 28a. The voltage across the capacitor 28a is measured by a voltage divider circuit including serially connected resistors 34a and 36a coupled across the capacitor 28a. The junction between the serially connected capacitors 34a and 36a is connected through a capacitor 38a and a Zener diode 40a to the gate of the SCR 32a. The resistors 34a and 36a are made large compared to resistor 26a and, besides serving as a voltage divider circuit, form a necessary "bleeder" for the capacitor 28a. The capacitor 38a protects the gate of the SCR 32a against overheating due to currents that would otherwise flow through the gate long after the SCR 32a is rendered conductive.

In operation of a switch arrangement, including a plurality of the modules of FIG. 3, when the current interrupting means 20 is closed, all the SCR's 32a through 32n are in their blocking states and the SCR's 22a through 22n are in their conducting states. When the current interrupting means 20 is first opened, the current ($I_o$) through the switch flows through the capacitor 28a and the SCR's 22a through 22n. The voltage across the capacitor 28a increases linearly with time until it reaches a critical voltage (Vc) that causes the Zener diode 40a to conduct current. When the Zener diode 40a conducts current, the SCR 32a is gated and the SCR 32a is rendered conductive. The resistance (R) of the resistor 26a is selected so that the critical voltage is greater than $R \times I_o$, which the current through the SCR 32a increases rapidly to $I_o$ and the current through the SCR 22a decreases to zero turning off the SCR 22a. The same sequence of events now takes place at the neighboring module and the process continues in a "domino" fashion.

Figure 4:
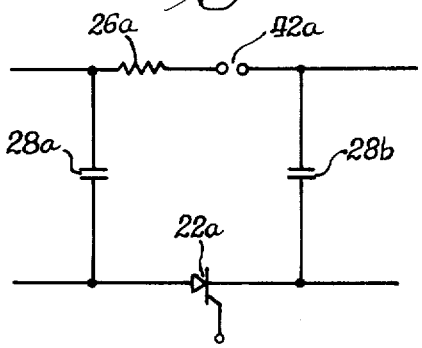
FIG. 4 is a schematic circuit diagram of a portion of a further embodiment of the switch arrangement of the present invention.

FIG. 4 shows another embodiment of the invention wherein a spark gap 42a employed as the nonlinear element in each of the modules. In operation of a switch arrangement including the spark gap modules of FIG. 4 when the current interrupting means 20 is first opened, the current $I_o$ flows through the switch through the capacitor 28a and the SCR's 22a through 22n. The voltage across capacitor 28a increases linearly with time until the critical voltage $V_c$ across spark gap 42a is reached. At this time, the spark gap 42a becomes conducting, the current through the spark gap 42a increases rapidly to $I_o$ if the resistance R is selected so that $V_c/R$ is greater than $I_o$. The current through the SCR 22a decreases rapidly to zero and the SCR 22a rendered nonconductive. The sequence repeats itself in the next module and subsequently in a "domino" fashion.

In a switch arrangement including the spark gap module embodiment of FIG. 4, the number of modules is selected so that the number of SCR's 22a through 22n times the maximum voltage ($V_{SCR}$) allowed across each of the selected SCR's is greater than the maximum desired voltage across the switch arrangement. The resistance R is selected to be equal to $V_{SCR}/I_o$. For minimum energy storage in the capacitors 28a through 28n, $V_c$ is chosen to be equal to $2 \times R \times I_o$ and the capacity of each capacitor is chosen to be equal to the minimum back bias time of the SCR divided by R. The minimum back bias time must be greater than the required turn off time of the selected SCR.

For large current flows, a parallel combination of the switch arrangements with the modules of FIG. 4 may be provided by connecting the switch arrangements together at the output terminals 10 and 12.

As can be seen from the above, the switch arrangement only requires one switch which is actuated by a triggering circuit or is commutated. Thus, only one triggering or commutation circuit is required. The rest of the switch elements are self-commutated. Voltage sharing is inherent in the circuit. Each capacitor needs to withstand high voltage only during the time the SCR in its module is being turned off. The maximum voltage occurring across each capacitor is only a fraction of the maximum voltage across the terminals 10 and 12. The rate with which the voltage across the switch increases may be kept relatively slow which can be used to avoid transients in other parts of the circuit.

Various changes and modifications may be made in the above described switch arrangement without deviating from the spirit and scope of the present invention. Various features of the invention are set forth in the accompanying claims.

What is claimed is:

1. A switch arrangement for interrupting a direct current of high amperage and voltage, comprising a pair of terminals, a current interrupting means connected by one end to one of said terminals, a plurality of thyristors serially connected in the forward direction between the other end of said current interrupting means and said other terminal, whereby when the current interrupting means is in a conductive state the direct current flows through said plurality of thyristors, a plurality of sets of a resistor series connected with a nonlinear element, said nonlinear element having a characteristic such that it impedes current flow when the voltage thereacross or the time integral of the voltage is small and more freely allows current flow through it when the voltage or time integral of the voltage is large, means for serially connecting said sets between said terminals, said resistor-nonlinear element sets being associated with respective thyristors, and a plurality of capacitors being coupled between respective associated resistor-nonlinear element sets and thyristors.

2. A switch arrangement in accordance with claim 1 wherein the nonlinear element is a saturable inductor.

3. A switch arrangement in accordance with claim 1 wherein the nonlinear element is a spark gap.

4. A switch arrangement in accordance with claim 1 wherein the nonlinear element is an SCR which is triggered by a preselected voltage across the associated capacitor.

5. A switch arrangement in accordance with any of claims 1, 2, 3 or 4 wherein the thyristors are silicon controlled rectifiers.

6. A switch arrangement in accordance with claim 2 wherein the resistors, the saturable inductors and the capacitors are respectively of equal value.

7. A switch arrangement in accordance with claim 2 wherein at least one additional circuit of serially connected thyristors is connected by capacitors to common sets of serially connected resistors and inductors.

* * * * *